(12) United States Patent
Kostamo et al.

(10) Patent No.: US 11,414,758 B2
(45) Date of Patent: Aug. 16, 2022

(54) SAMPLE PROTECTION

(71) Applicant: PICOSUN OY, Espoo (FI)

(72) Inventors: Juhana Kostamo, Vantaa (FI); Väinö Kilpi, Espoo (FI); Riina Ritasalo, Espoo (FI)

(73) Assignee: PICOSUN OY, Espoo (FI)

( * ) Notice: Subject to any disclaimer, the term of this patent is extended or adjusted under 35 U.S.C. 154(b) by 84 days.

(21) Appl. No.: 16/830,794

(22) Filed: Mar. 26, 2020

(65) Prior Publication Data

US 2020/0308698 A1 Oct. 1, 2020

Related U.S. Application Data

(60) Provisional application No. 62/826,354, filed on Mar. 29, 2019.

(51) Int. Cl.
*C23C 16/458* (2006.01)
*C23C 16/02* (2006.01)
*C23C 16/455* (2006.01)

(52) U.S. Cl.
CPC ...... *C23C 16/4583* (2013.01); *C23C 16/0227* (2013.01); *C23C 16/45527* (2013.01)

(58) Field of Classification Search
CPC .............. C23C 16/45555; C23C 16/4581
See application file for complete search history.

(56) References Cited

U.S. PATENT DOCUMENTS

| | | |
|---|---|---|
| 5,755,937 A | 5/1998 | Patterson et al. |
| 2006/0196418 A1 | 9/2006 | Lindfors et al. |
| 2010/0154567 A1* | 6/2010 | Menard .................. G01N 3/02 73/864.91 |
| 2012/0055407 A1* | 3/2012 | Maula .................. C23C 16/4581 118/729 |
| 2015/0021238 A1 | 1/2015 | Gandhi et al. |

FOREIGN PATENT DOCUMENTS

CN 107502873 A 12/2017

OTHER PUBLICATIONS

Extended European Search Report issued in European Patent Application No. 20 165 559.4 dated Oct. 2, 2020.

* cited by examiner

*Primary Examiner* — Joseph A Miller, Jr.
(74) *Attorney, Agent, or Firm* — Nixon & Vanderhye

(57) ABSTRACT

A substrate holder 10 in the form of a mesh structure with a sample-receiving surface 10A is provided. The substrate holder 10 containing the samples 21 is at least partially folded and inserted into a substrate processing apparatus to produce coated samples 21A by directing at least one coating material P1, P2, ..., Pn onto the samples through the mesh structure. A substrate processing system and a method for producing coated substrates are further provided.

10 Claims, 2 Drawing Sheets

SAMPLE PROTECTION

FIELD OF THE INVENTION

The invention relates to methods and apparatuses for substrate processing. More specifically, the invention relates to equipment and related appliances, such as substrate holders, for processing substrates to be coated and related methods.

BACKGROUND OF THE INVENTION

A number of methods of analysis require use of miniature samples, as sized within a range of few micrometers to few millimeters. For example, in Transmission Electron Microscope (TEM) analyzing methods, small samples are handled on certain types of miniature grids. Sometimes the samples on such grids must be isolated from the ambient, for stability reasons, for example. This could be implemented by coating the samples with a thin coating layer.

Still, to analyze a series of samples, it is important that the film coatings are uniform throughout all samples. Not only the samples must be identical to one another, but also the coating properties must possess necessary uniformity, e.g. a nonappearance of pinholes, which could otherwise ruin the sample or the entire series.

Thin-film deposition methods, wherein thin film coatings are deposited on substrates from a vapor phase, are extensively described in the art. Atomic Layer Deposition (ALD) technology generally regarded as a subclass of Chemical Vapor Deposition (CVD) has proved its efficiency in manufacturing high-quality conformal coatings on three-dimensional substrate structures.

Still, conventional ALD techniques face certain challenges in coating the miniaturized samples, in particular, the samples, whose size does not fall below tens of millimeters. Thus, coating of miniature substrates by conventional ALD methods requires placing the samples, often manually, e.g. with tweezers, on a planar solid support, e.g. on a silicon wafer, whereby a situation may arise with silicon surfaces facing one another (with a silicon chip placed against a silicon wafer). The coating emerging at silicon-silicon interfaces is often deficient. Additionally, manual placing of the substrates onto the support is laborious and often it leads to contamination and/or damage of the samples and the support. Due to these reasons, uniform coating is extremely challenging or even impossible.

Additionally, such samples are easily lost during handling, as subjected to continuous gas flow through the reaction space, if not attached/fixed to the support or otherwise protected. However fixing the substrates on support and provision of any protective shields therearound reduce coating quality dramatically.

In this regard, an update in the field of processing the substrates, inter alia by coating via chemical deposition methods in gaseous (vapour) phase, is still desired. In particular, the challenges associated with coating miniature samples should be addressed.

SUMMARY OF THE INVENTION

An objective of the present invention is to solve or to at least alleviate each of the problems arising from the limitations and disadvantages of the related art. The objective is achieved by various embodiments of a substrate holder and a related assembly for a substrate processing apparatus, a substrate processing system and a method for producing coated substrates.

In an aspect, a substrate holder is provided according to what is defined in independent claim 1.

In embodiment, a substrate holder is configured as a mesh structure with a sample-receiving surface. The substrate holder receives, onto the sample-receiving surface, at least one sample substrate such, as to at least partially enclose said at least one substrate. The substrate holder is configured to allow the substrate(s) to be coated by propagating at least one coating material through the mesh structure to produce a coated substrate. In embodiment, the substrate holder comprises means render a number of the substrate holders stackable. Said means enable a number of substrate holders to be piled one above another, optionally, into a number of adjacent arrays.

In embodiment, the substrate holder is configured to fold such, as to form an enclosure for the at least one substrate received at the sample-receiving surface.

In embodiment, the substrate holder is configured to fold, optionally along a folding line, such, as to fully enclose the at least one substrate received at the sample-receiving surface.

In embodiment, in said substrate holder, the mesh structure is rendered with a predetermined mesh size to retain the at least one substrate on the sample-receiving surface.

In embodiment, the substrate holder comprises at least one coating layer configured to render the mesh structure with at least one predetermined property. In embodiment, said at least one coating layer is configured to at least prevent the substrate(s) received on the mesh structure from being contaminated during subsequent coating with the coating material.

In an aspect, a substrate holder assembly is provided according to what is defined in the independent claim 7.

In embodiment, the substrate holder assembly is configured to support a number of the substrate holders, according to the embodiments, in at least partially folded form, optionally one above another.

In an aspect, a method for producing coated substrates is provided according to what is defined in the independent claim 8.

In embodiment, the method comprises: obtaining a substrate holder configured as a mesh structure with a sample-receiving surface; placing at least one sample substrate onto said sample-receiving surface such, that the substrate holder at least partially encloses said at least one substrate; and in a substrate processing apparatus, coating the substrate(s) by directing at least one coating material onto the substrate(s) through the mesh structure, whereby a coated substrate is produced. It is preferred that the substrate(s) are subjected to a pre-treatment, in a substrate pre-treatment apparatus, to remove impurities from the substrate surfaces. In embodiment, said pre-treatment includes plasma treatment of the substrate(s).

In embodiment, coating of the at least one substrate is implemented by a process of chemical deposition in vapour phase, such as Atomic Layer Deposition.

In embodiment, the method further comprises applying at least one coating layer onto the mesh structure forming the substrate holder, whereby the mesh structure is rendered with at least one predetermined property. Said at least one coating layer is applied onto the mesh structure prior placing the substrate(s) thereto.

In an aspect, a system for processing substrates is provided according to what is defined in the independent claim 12.

In embodiment, the system comprises: a pre-treatment apparatus; a substrate holder assembly, in which a number of substrate holders are supported, in at least partially folded form, optionally one above another; a substrate processing apparatus with a process chamber for coating substrates provided in the substrate holders; and a substrate handling arrangement configured to mediate a transfer of the substrates and/or the substrate holders between the pre-treatment apparatus, the substrate holder assembly and/or the substrate processing apparatus.

Each substrate holder provided in the substrate holder assembly is preferably a mesh structure configured to receive at least one sample substrate and to at least partially enclose said substrate.

In embodiment, the substrate pre-treatment apparatus is configured to treat the at least partially enclosed substrate(s) to remove impurities from the substrate surfaces in a process of a plasma treatment.

In embodiment, the substrate handling arrangement comprises at least one loader robot. In embodiment, the substrate processing apparatus is a reactor for chemical deposition in vapour phase, such as an Atomic Layer Deposition (ALD) reactor.

Without limiting the scope and interpretation of the patent claims, certain technical effects of one or more of the example embodiments disclosed herein are listed in the following.

At first, the invention offers a simple and cost-effective way to coat, by chemical gaseous (vapour) phase deposition methods, the three-dimensional miniature substrates, e.g. those sized down to 10 micrometers. Coating of such substrates by conventional methods often requires manual placing of the samples on a planar solid support, as described hereinabove. The coating films thus produced are often deficient. The invention effectively solves this problem, in conjunction not only with semiconductor industries, but also for coating of the miniature objects of any kind, e.g. medical/dental instruments, implants, and the like.

In the gaseous (vapour) phase deposition systems, such as ALD, the reactive fluids (gases) penetrate through holes, cavities, cracks etc. of macroscopic structures to coat internal surfaces as well. The invention provides a simple solution for a substrate holder configured as a mesh structure or as an essentially porous structure. Samples to be coated are preserved inside the mesh/web, whereby their exposure to mechanical handling tools (during transition between the apparatuses, batch units, etc.) can be avoided or at least minimized. Additionally, a plurality of miniature samples can be coated at once. With the mesh structure being at least partially folded (closed), coating of the samples is as effective as it would be performed without the mesh/web covering; however, the samples will be protected by virtue of being contained in the at least partially closed structure.

The substrate holder(s) and related assemblies disclosed hereby enable efficient use of the entire (three-dimensional) volume inside the processing apparatus and enable efficient loading and unloading of samples.

Furthermore, the present invention offers a possibility to integrate cleaning of contaminated samples into a coating production line (the line to produce coated samples). The invention advantageously exploits plasma cleaning which can efficiently remove organic contaminants, for example, from the substrates. Plasma treatment well combines with the processes of chemical vapour deposition, especially with the processes of atomic layer deposition, since similar equipment can be utilized. By producing plasma species, substrate assemblies of any shape can be treated with carefully selected process parameters. The invention allows for packing the substrates in such a way that enables fully automated handling of the substrate batches during handling in a clean room, for example, and/or during the coating processes. The invention offers a substrate processing system capable of operating for more than 60 hours fully automatically. The substrate holder appliances prevent the substrate samples from escaping (e.g. by falling out) during handling and propagating the gas flow stream between the substrates.

The invention further allows for depositing uniform, conformal film coatings on every face of three-dimensional substrates of essentially any shape.

In the present disclosure, materials with a layer thickness below 1 micrometer (μm) are referred to as "thin films".

The expression "a number of" refers herein to any positive integer starting from one (1), e.g. to one, two, or three; whereas the expression "a plurality of" refers herein to any positive integer starting from two (2), e.g. to two, three, or four.

The terms "first" and "second" are not intended to denote any order, quantity, or importance, but rather are used to merely distinguish one element from another.

BRIEF DESCRIPTION OF THE DRAWINGS

The invention will now be described, by way of example only, with reference to the accompanying drawings, in which.

DETAILED DESCRIPTION

Figure 1:
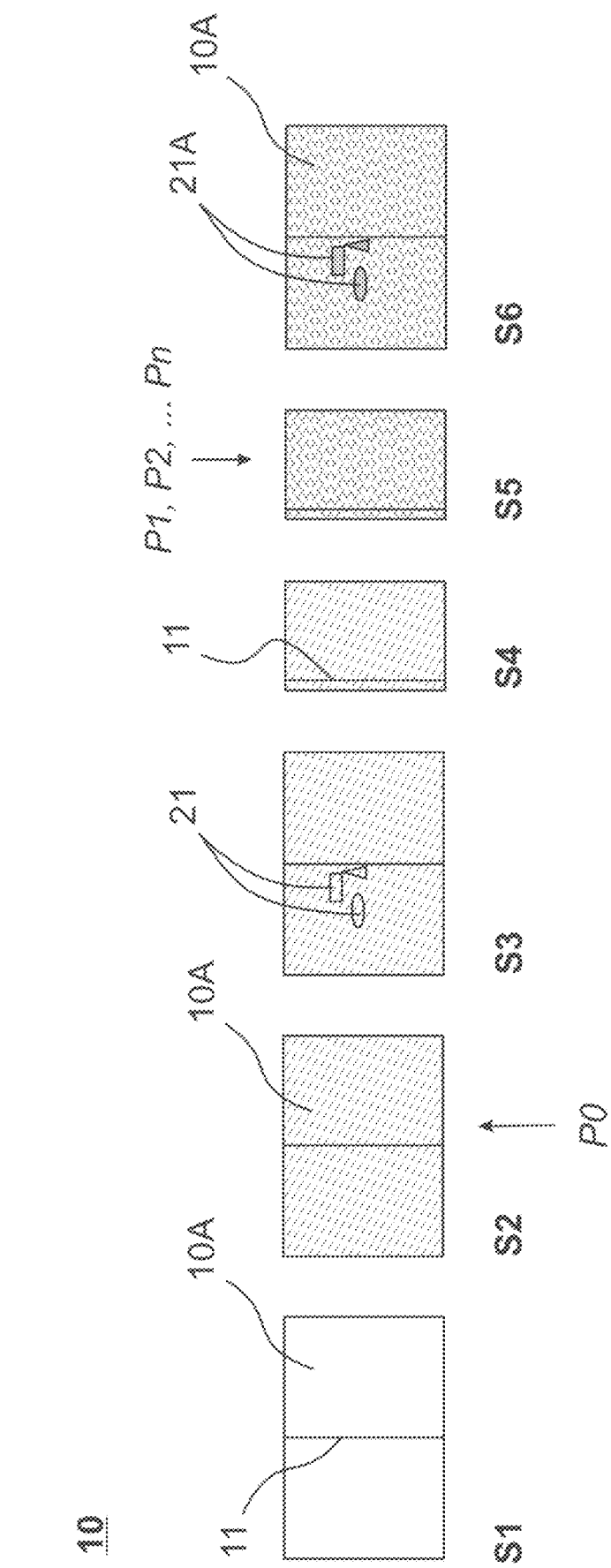
FIG. 1 illustrates, at 10, a substrate holder, according to an embodiment.

The invention, according to one aspect, pertains to provision of a substrate holder 10 for at least one sample substrate 21 (FIG. 1). In the present disclosure, the term "substrate" is generally used to designate a sample (an item or a part of the item) to be handled.

In exemplary configuration shown on FIG. 1 the substrate holder 10 is provided as an essentially planar item, capable of being folded and made of a piece/a sheet of foldable (viz. flexible, deformable) material. FIG. 1 illustrates the substrate holder 10 as a rectangular shaped sheet; however, other shapes (square, elliptical or more complex shapes) are not excluded. The essentially foldable substrate holder is configured as a mesh structure. By the term "mesh structure" we refer, in the present disclosure, to any material provided in the form of a mesh, e.g. a wire-mesh, and/or any mesh- or web-like material, such as a mesh-/web fabric or an essentially porous material (porous mesh). In fact, the mesh structure can be established by any material, through which the predetermined chemical substances can reach the substrate(s) 21 in an unhindered manner, by passing through the mesh or the pores in said material, whereupon a uniform coating layer can be formed on the surfaces of each said substrate(s).

The mesh structure can be made of material flexible/foldable in an absence of mechanical impact, i.e. by gravity, or it can be configured flexible/foldable upon executing a mechanical impact thereon (e.g. mechanical shaping, folding, rolling, etc.).

The mesh can be formed with various materials, e.g. fabric, fibrous materials (e.g. paper), plastic, metal, ceramics, and/or the combinations thereof, as such and can be (pre)coated with a suitable coating that would not disturb the intended analysis- and/or subsequent processing of the samples and/or the foldable mesh structure forming the substrate holder.

In the substrate holder 10, the mesh structure is advantageously rendered with a predetermined mesh (pore) size to retain the at least one substrate 21 on the sample-receiving surface 10A. In other words, the mesh (size) is sufficiently small to prevent the substrate(s) from escaping through the mesh and it is sufficiently large to let deposition chemicals and/or other processing chemicals diffused in gaseous (vapour) phase through said mesh.

Selection of the mesh (pore) material is made based on the nature of the sample substrates 21 intended for processing, such as coating, the processing/reaction conditions and/or the process design.

The mesh structure comprises a sample receiving surface 10A. In the example shown on FIG. 1 the sample-receiving surface can be formed with a surface of the mesh structure, onto which the sample substrate(s) 21 is/are placed. In such configuration, any surface of the mesh structure can serve as a sample-receiving surface 10A. In some instances, a face intended for use as a sample-receiving surface 10A may be pre-applied with a substance, such as an adhesive, to hold the substrates in place. In such an event, the surface 10A may act as a sample attachment surface.

The substrate samples 21 are illustrated on FIG. 1 as a rectangular object, ellipse shaped object and a triangular object. This is to emphasize that differently sized and/or shaped samples can be placed into the substrate holder at once. In terms of its' size, the substrate holder 10 is advantageously adapted to hold a number of essentially small-sized substrates, sized within a range of about 10 micrometers (μm) to about 20-25 cm. For smaller substrates a very fine mesh is required and it may be challenging to attain uniform coating on each substrate item when the latter move within the substrate holder (as discussed below). Larger substrates, due to size and weight thereof, may be more advantageously processed using conventional table substrate holders. Nevertheless, presented technology does not preclude from using the mesh substrate holders 10 with the substrates whose size falls outside the above-identified range.

Accordingly, the shape and/or the overall configuration of the substrate holder 10 varies depending on the size of substrate samples 21 intended for use with said substrate holder.

The substrates 21 are provided as tools and parts thereof utilized in a variety of fields. The substrates can be configured as three-dimensional items, such as medical instruments, elements and parts used in semiconductor industry, (bio)technological industry and/or space-related industries. The substrates can be made of any suitable material, such as metal and metal alloys, silicon, glass, ceramics, plastic polymers, and any combination thereof.

In some instances, the substrate 21 is provided as an optionally elongated body with an internal channel, a cavity and/or any one of the internal and external features, such as protruding parts or recesses, e.g. grooves.

The substrate holder 10 with the sample substrate(s) 21 placed onto/at the sample-receiving surface 10A is configured to at least partially enclose said substrate or substrates.

The substrate holder 10 with the sample substrate(s) 21 placed onto/at the sample-receiving surface 10A is configured such, as to at least partially enclose said substrate or substrates.

Referring back to a configuration shown on FIG. 1, the substrate holder 10 with the sample substrate(s) 21 placed onto/at the sample-receiving surface 10A is configured to reshape such, as to at least partially enclose said substrate or substrates. At least partial reshaping of the mesh structure/ the substrate holder occurs upon bringing said substrate holder into an operating position, i.e. the position adopted during substrate handling. Thus, a cradle-like configuration can be adopted by simply suspending the mesh material by edges or corners to form a "bag" or a cradle.

Additionally the substrate holder can be configured to at least partially enclose the substrate(s) 21 essentially without being reshaped. In such an event, the substrate holder 10 can be provided as a mesh structure in the form of a receptacle. The cradle-like configuration is thus adopted by virtue of the substrate holder being shaped as a receptacle. The receptacle can be shaped as desired/required by the process or apparatus parameters. To retain the mesh structure in shape, the substrate holder 10 can further comprise a reinforcing means, such as an essentially rigid (non-flexible) frame or a similar arrangement. The frame can be arranged around the edge(s) of said receptacle. By way of example, in its cross-section, the frame may adopt various shapes, e.g. essentially rectangular, circular, elliptical, and the like.

The cradle is thus formed with at least partially foldable mesh structure provided as the substrate holder optionally retained in shape with the reinforcing means, such as a frame. In some instances, in particular, when formation of a cradle require reshaping the mesh structure, the substrates may change their original position (as placed onto the sheet of fabric when the latter is spread/unfolded on a solid support).

Mentioned cradle, due to its configuration, forms at least partial enclosure for the substrates 21.

The cradle configuration denotes the operating position of the substrate holder. The cradle is transferred into the substrate holder assembly and/or into a substrate processing apparatus, as described further below.

It is further preferred that the cradle/the substrate holder 10 further comprises a number of appliances, collectively referred to as attachment means, that enable a number of substrate holders to be piled one above another. The attachment means thus render a number of the substrate holders stackable. Said attachment means include, but are not limited to a frame (also providing necessary reinforcement), various connectors (hooks, loops and the like), clamp connectors (clips, claw clamps, etc.), and slidable arrangements (slides, rails). Cited means can be combined as desired (e.g. a frame with slidable means). Clamp connectors may be beneficial on connecting the edges of entirely flexible substrate holder (e.g. without reinforcing frames).

Some of the attachment means, e.g. clamps, can also serve as closing means (not shown).

By the attachment means cited above, the substrate holders 10 are arranged to form piles, having at least two cradles in a pile. The piles (stacks) can be further grouped into a number of vertical arrays either adjacent to one another or grouped around a central stand, for example (within a substrate holder assembly, as discussed hereinbelow). By expressions "piling" and "stacking" we refer, in the present disclosure, to a number of cradles suspended one above another, as assisted by the attachment means. The substrate holders 10 are arranged in the pile (stack) such, that unhindered flow of reactive fluid(s) is enabled therebetween.

Additionally or alternatively, the substrate holder 10 can be configured to fold such, as to form a full enclosure for the at least one substrate 21 received at the sample-receiving surface 10A. Formation of such enclosure is schematically illustrated on FIG. 1. In unfolded (open) position, the substrate holder 10 receives the substrates 21 (S3). The substrate holder 10 is folded (S4) along a folding line 11 such, as to fully enclose the substrate(s) (21) received onto the mesh structure, namely, at the sample-receiving surface 10A.

The folding line 11 may be marked on the mesh material or it can be an imaginary line traced approximately through a midpoint of the mesh structure to divide it onto two approximately equal halves.

Although the folding line 11 is illustrated on FIG. 1 as a vertical line, at about a half way of the horizontal sides of the mesh structure, its position in respect to the mesh structure or the shape of the mesh structure as such is not limited only to the shown example. The folding line 11 may also refer to a hinge assembly, including a flexure structure.

The foldable mesh structure can thus be rigid in suitable parts. A skilled person may figure out, based on the present disclosure, that certain parts of the mesh structure, such as those formed along the folding line 11, for example, can be imparted with additional (essentially rigid) for gaining mechanical stability.

In the example shown on FIG. 1, the substrates 21 are positioned onto the substrate holder 10/the mesh structure, namely, on the sample-receiving surface 10A, generally at a position between the folding line and the edge of the mesh structure. The halves are wrapped/folded such that the substrate(s) 21 become covered by material forming the substrate holder, hereby, the mesh material. The sample-receiving surface 10A is facing inside. Thus produced "envelop" may be further secured at the edges by closing means (not shown). When the folded (closed) substrate holder is collected for further transfer towards/into the substrate processing apparatus (described further below), the substrates may change their positions in relation to one another. Whether an internal surface (hereby, the sample-receiving surface 10A) is configured as the attachment surface, the substrates may remain in place.

The substrate holder may be further configured as a rolled structure (not shown).

Folded substrate holder (S5, FIG. 1) is transferred into the substrate processing apparatus for coating. In order to be coated, at least one coating material P1, P2, . . . , Pn is allowed to pass through the mesh structure, whereby a coated substrate 21A (S6) is produced.

A coating is applied onto the substrates 21 by a method of chemical deposition in gaseous (vapour) phase, such as Atomic Layer Deposition (ALD) or, alternatively, Chemical Vapour Deposition (CVD). In some instances, the coating comprises at least one metal compound.

The basics of an ALD growth mechanism are known to a skilled person. ALD is a special chemical deposition method based on the sequential introduction of at least two reactive precursor species to at least one substrate. It is to be understood, however, that one of these reactive precursors can be substituted by energy when using, for example, photon-enhanced ALD or plasma-assisted ALD, for example PEALD, leading to single precursor ALD processes. For example, deposition of a pure element, such as metal, requires only one precursor. Binary compounds, such as oxides can be created with one precursor chemical when the precursor chemical contains both of the elements of the binary material to be deposited. Thin films grown by ALD are dense, pinhole free and have uniform thickness.

The at least one substrate is typically exposed to temporally separated precursor pulses in a reaction vessel to deposit material on the substrate surfaces by sequential self-saturating surface reactions. In the context of this application, the term ALD comprises all applicable ALD based techniques and any equivalent or closely related technologies, such as, for example the following ALD sub-types: MLD (Molecular Layer Deposition), plasma-assisted ALD, for example PEALD (Plasma Enhanced Atomic Layer Deposition) and photon-enhanced Atomic Layer Deposition (known also as photo-ALD or flash enhanced ALD). The process can also be an etching process, one example of which being an ALE process. It should be noted that with PEALD and photon-enhanced ALD, the additive treatment can be limited to the surfaces visible to the radiation source.

ALD is based on alternating self-saturative surface reactions, wherein different reactants (precursors) provided as chemical compounds or elements in a nonreactive (inert) gaseous carrier are sequentially pulsed into a reaction space accommodating a substrate. Deposition of a reactant is followed by purging the substrate by inert gas. Conventional ALD deposition cycle proceeds in two half-reactions (pulse A—purge A; pulse B—purge B), whereby a layer of material is formed in a self-limiting (self-saturating) manner, typically being 0.05-0.2 nm thick. Typical substrate exposure time for each precursor ranges within 0.01-1 seconds.

Pulse A comprises a first precursor in a gaseous phase (first precursor vapour) and pulse B comprises a second precursor in a gaseous phase (second precursor vapour). Inactive gas and a vacuum pump are typically used for purging gaseous reaction by-products and the residual reactant molecules from the reaction space during purge A and purge B. A deposition sequence comprises at least one deposition cycle. Deposition cycles are repeated until the deposition sequence has produced a thin film or coating of desired thickness. Deposition cycles can also be either simpler or more complex. For example, the cycles can include three or more reactant vapour pulses separated by purging steps, or certain purge steps can be omitted. On the other hand, photo-enhanced ALD has a variety of options, such as only one active precursor, with various options for purging. All these deposition cycles form a timed deposition sequence that is controlled by a logic unit or a microprocessor.

It is preferred that the coating is applied (S5) to the substrate(s) 21 by ALD.

For the purposes of the invention, the coating materials P1, P2, . . . , Pn designate precursor compounds P1, P2, etc. By way of example, to provide an ALD coating film, in an ALD deposition cycle, at least two precursors (e.g. P1 and P2) should be sequentially pulsed into the reaction space (with purges of inert gas in between). In ALD, each coating material (precursor) must be delivered into the reaction space one at a time. Therefore, ALD coating of the substrate(s) 21 is implemented by sequentially directing first- and second precursors into the reaction space, wherein said precursors are allowed to propagate through the mesh structure to produce a deposition (sub)layer. A coating film of desired thickness (comprising a desired number of deposition (sub)layers) is formed in a number of deposition cycles. The coated substrate 21A obtained at S6 (FIG. 1) may comprise a number of such deposition (sub)layers, wherein each subsequent (sub)layer is "stacked" on the top of a preceding (sub)layer.

The substrate holder 10 can further comprise at least one coating layer P0 applied through directing at least one coating chemical, indicated hereby as P0, onto the mesh structure (S2, FIG. 1), in an absence of substrate(s) 21 on said mesh. The coating layer P0 is configured to render the mesh structure with at least one predetermined property. The coating layer(s) P0 can be configured to at least prevent the substrate(s) 21 received on the mesh structure from being contaminated during subsequent deposition coating with precursors P1, P2, . . . , Pn.

Additionally or alternatively, the mesh structure can undergo a cleaning procedure or procedures aiming at removal organic and/or inorganic residue (oils, biological residue) therefrom and/or a procedure of leveling out the surface of said mesh structure. The latter procedure can be accomplished via coating with the compound P0.

Additionally or alternatively, the pre-coating P0 applied onto the mesh structure prevents or at least reduces the impacts exerted onto said mesh structure/the substrate holder 10 during subsequent substrate processing procedure(s), such as substrate coating in the ALD apparatus. By carefully selecting the pre-coating chemicals (P0), the surface material of said mesh structure can be prevented from excessive tearing off (e.g. during plasma treatment) and/or from material deposition thereat.

The latter can be attained by depositing the mesh structure, during the pre-coating step, with the coating layer P0 comprising film growth inhibitor(s). Exemplary film growth inhibitors include self-assembly monolayers (SAM), such as that of long-chain alkylsilanes. These compounds hinder or prevent chemically deposited coating films/layers from growing on the surfaces. SAMs prevent the mesh structure from being deposited with the coating layer(s), therefore, only the substrate(s) 21 become coated at the subsequent stage(s).

Additionally or alternatively, photon-enhanced ALD or plasma-assisted ALD can be used to exert patterning effect with a mask. Pre-coating P0 of the mesh structure can thus be attained by substantially same methods as utilized for the subsequent substrate coating. In some instances, pre-coating of the mesh material may require utilizing more than one chemical, e.g. in case the ALD technology is adopted.

In another aspect, the invention further pertains to a method for producing coated substrates 21A. The method is schematically illustrated by FIG. 1.

The method starts at S1, by obtaining the substrate holder 10 configured as the mesh structure with the sample-receiving surface 10A, as described hereinabove. At S1, the substrate holder is in unfolded (open) position. At least one sample substrate 21 is positioned (stage S3) onto the mesh structure, namely, onto the sample-receiving surface 10A. The substrate holder 10 is configured to at least partially enclose said at least one substrate 21. At least partial enclosure (so called cradle) is formed thereby. Mentioned cradle can be provided as a full enclosure optionally sealable by the closing means (not shown). Folding can be optionally implemented along the folding line 11.

FIG. 1 illustrates a situation, where the sample substrates 21 are placed or inserted (S3) on the mesh structure, to a position between the folding line 11 and the edge of the mesh material. In present exemplary configuration, the samples are protected by the foldable mesh structure of the substrate holder 10 between its halves, which are folded (S4) like a book and optionally locked to the folded position by the closing means (not shown).

Folded substrate holder 10 containing the sample substrates 21 in the at least partial enclosure (full enclosure is shown on FIG. 1; S4) is ready for the coating process.

At S5, the sample substrates 21 are coated in the substrate processing apparatus by directing at least one coating material P1, P2, . . . , Pn onto the substrate(s) through the mesh structure, whereby the coated substrate 21A is produced. At S6, the substrate holder(s) 10 are withdrawn from a processing space and the coated substrates 21A can be retrieved from the substrate holder(s) 10. In some instances, as shown on FIG. 1 (S6), the substrate holder 10 needs to be unfolded. That the substrates 21A are coated is indicated, on FIG. 1, with a solid fill of otherwise transparent shapes; compare S3—uncoated samples and S6—coated samples.

In the method, at least one coating layer P0 can be applied (S2) onto the mesh structure (the substrate holder 10) prior the substrates 21 are placed onto said mesh. During pre-coating (S2) the mesh structure may be unfolded. In said pre-coating step, the mesh structure is rendered with at least one predetermined property, such as preventing contamination of the samples, and/or other properties discussed hereinabove. By way of example, a pre-coat P0 with a contamination-preventive functionality may be formed from titanium oxide ($TiO_2$) and/or aluminium oxide ($Al_2O_3$).

A skilled person, based on the examples presented hereinabove, shall identify a particular subtype of the coating process and shall properly apply the teaching of this invention to select the reactor apparatus(es) according to the sample-specific standpoints.

The coating process (S5) is applicable to coat the sample substrate(s) 21 through the mesh (structure). By using ALD, conformal, uniform coating can be produced through/on all surfaces of all samples. Mesh structure enables or at least facilitates this task. Substrates 21 may be retained apart from one another in the sample attachment surface area (formed at the sample-receiving surface 10A) while the substrate holder is folded, upon being coated in substrate processing apparatus.

Alternatively, the substrates 21 in the holder 10 may be forced, e.g. by gravity, to gather/group together (if/when not retained in place); however, this does not prevent the substrates from being coated. In particular, such free-stand configuration is beneficial for the smaller substrates, which become coated by virtue of the gaseous flow (containing precursors diffused in the carrier gas) continuously flowing through the reaction space and between the samples, accordingly. Small samples (e.g. about 10 micrometers to about 1-2 cm in size) simply float ("levitate") in the folded sample holder in said gaseous phase flow propagating through the mesh structure. In such configuration, the folded substrate holder 10 can be viewed as a closed container, in which the samples 21 are allowed to freely move within the space limited by the interior of said container, during the coating process (S5).

During the coating procedure, while the gases diffuse easily through the mesh structure, the samples do not fall into the gas lines, pump lines, etc.

It is preferred that the substrate(s) 21 are additionally subjected to a pre-treatment S4' (FIG. 2), in a substrate pre-treatment apparatus, to remove impurities from the substrate surfaces.

Figure 2:
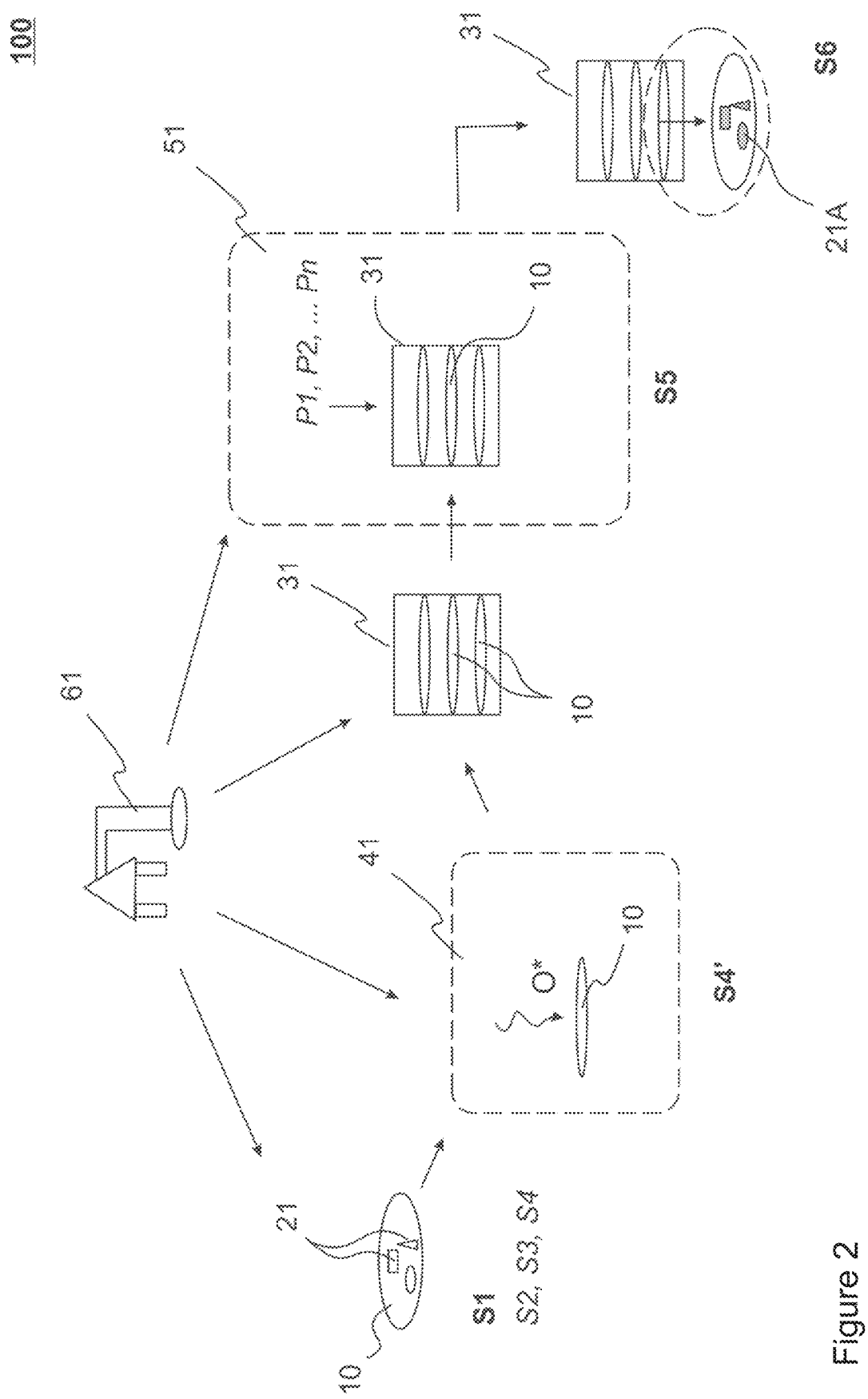
FIG. 2 schematically illustrates, at 100, a system for processing substrates, according to embodiments.

In still further aspect, the invention pertains to a system for processing substrates. FIG. 2 illustrates, at 100, a concept underlying the embodiments of said system.

The system 100 comprises a substrate processing apparatus 51 with a process chamber (reaction chamber) for coating the sample substrates 21 loaded into said reaction chamber. The samples 21 are loaded into the chamber in the substrate holders 10. The substrate chamber is configured to accommodate a number of substrate holders 10.

For the purposes of the present invention it is preferred that the substrates 21 in the substrate holders 10 are placed into a substrate holder assembly 31 (a so called "cradle assembly"), which, in turn, can be inserted into the processing apparatus 51.

The substrate holder assembly 31 comprises a number of the substrate holders 10 supported, in at least partially folded form, in a cradle-like manner. The substrate holders 10 are preferably arranged one above another to form a pile (stack), as described hereinabove. Still, any other suitable configuration can be adopted. The expression "in cradle-like manner" aims at emphasizing that the substrate holders 10 are supported in the assembly 31 by means of appropriate appliances, in particular, suspended above one another to form a vertical pile. Each assembly 31 may comprise the cradles 10 in partially- and/or fully enclosed configurations.

The assembly 31 further comprises means for supporting- and/or for holding supported/suspended cradles 10 thereat. Supporting element(s) can be a framework, such as a rack, and/or a container, for example. In some instances, it is beneficial to insert the rack (the assembly 31) that supports at least one substrate holder 10, preferably, at least two substrate holders arranged into a (vertical) pile, into the reaction chamber of the processing apparatus. In some instances, the container or a tank provided within the assembly may be configured such, that the enclosure formed by said tank forms the reaction chamber.

The sample holders 10 are supported on the framework, such as the rack, one above another (to form a pile), by the attachment means described hereinabove. In preferred configurations, the substrate holders 10 arranged into (vertical) piles are suspended (viz. arranged to hang) on the rack. A number of vertical arrays (with "stacked" substrate holders) can be arranged side-by-side or around a central support. By such an arrangement, the substrate(s) 21 are suspended in the substrate holder(s) 10 during processing.

Still, placing the substrate holders on a planar support, such as a table-like support, is not excluded.

The substrate processing apparatus 51 is preferably configured to exploit the vapour-deposition based techniques. In terms of an overall implementation, the reactor 100 may be based on an ALD installation trademarked as Picosun R-200 Advanced ALD system available from Picosun Oy, Finland. Nevertheless, the features underlying a concept of the present invention can be incorporated into any other chemical deposition reactor embodied as an ALD, MLD (Molecular Layer Deposition) or CVD device, for example.

Mentioned apparatus thus comprises the reaction chamber, with the reaction space (deposition space) established by the interior thereof. The reactor further comprises a number of appliances configured to mediate fluidic flow (inert fluids and reactive fluids containing precursor compounds P1, P2) into the reaction chamber. Mentioned appliances are provided as a number of intake lines/feedlines and associated switching and/or regulating devices, such as valves, for example.

Precursor(s) P1, P2, . . . , Pn are delivered into the reaction space in an essentially gaseous form. Reactive fluid entering the reaction chamber through at least one feedline is preferably a gaseous substance comprising a predetermined precursor chemical carried by an inert carrier (gas). Delivery of the precursor chemicals into the reaction space and film growth on the substrate is/are regulated by means of the abovesaid regulating appliances, such as e.g. three-way ALD valves, mass-flow controllers or any other device suitable for this purpose.

The apparatus further comprises an evacuation line for discharging an exhaust flow out of the reaction chamber. The evacuation line constitutes a fore-line for an evacuation pump and it may comprise, in some configurations, a closing valve, preferably upstream the pump unit. Such pump fore-line assembly can further comprise means that enable the reactions with chemicals utilized, and/or means for neutralizing and/or removing said chemicals from the apparatus. Mentioned means include, but are not limited to generally known ALD tools and appliances, such as any one of an afterburner device (provides for mixing of reactive gases), a trap (provides for adsorption of chemicals and prevents the outflowing particles of matter from flowing into the pump), a scrubber, or a combination of the abovesaid. It is preferred that withdrawal of fluidic substance from the reaction chamber is implemented in an uninterrupted manner, whereby the pump, preferably configured as a vacuum pump, removes fluidic substance from the reaction chamber continuously during the entire deposition process.

The system 100 further comprises a pre-treatment apparatus 41 to perform the method step S4' as described hereinabove, whereat the substrate(s) 21 are subjected to a pre-treatment to remove impurities from the substrate surfaces. In the pre-treatment reactor 41, the substrates 21 can undergo a cleaning procedure by being exposed to at least one gas comprising or consisting a precursor compound reactive to the residue. The pre-treatment procedure may involve a plasma treatment. The plasma treatment may be implemented in a different apparatus and/or a reaction chamber, or in the same apparatus/reaction chamber, as the ALD treatment, arranged as a direct- or remote plasma setup.

The pre-treatment apparatus 41 can thus be configured as a plasma-enhanced ALD (PEALD) reactor or a photo-enhanced ALD reactor, for example. In PEALD reactor conditions, highly reactive ions and free radicals of the gaseous elements, such as oxygen or hydrogen, are typically formed. These highly reactive species react with the impurities on the substrate 21 surfaces and effectively clean them out.

Additionally or alternatively, the apparatus 41 can be further adapted to perform pre-coating and/or pre-cleaning of the mesh structures (S2, FIG. 1).

The pre-treatment step allows for efficiently cleaning the items, such as medical instruments, that have been in use and contain impurities/residue. The term "residue" is used hereby to indicate essentially solid remainings or debris, primarily of organic nature, accumulated or lodged on/in the medical/surgical instrument during its normal use, e.g. cell mass, cellular network debris, ambient contamination and the like.

In the example shown on FIG. 2 (S4'), the substrate(s) 21 are exposed to oxygen plasma. Oxygen plasma spices are highly reactive with various materials, especially carbon containing materials which are effectively reduced to $CO_2$ for example.

By adjusting the pre-treatment conditions, any kind of residue (e.g. essentially inorganic matter and/or a combination of organic and inorganic residue) can be efficiently eliminated.

The system 100 (FIG. 2) is advantageously configured for automated handling of substrate samples within a clean space (clean room), for example. It is preferred that the system is located in a clean room facility.

To implement the automated handling of sample substrates, the system 100 comprises a substrate handling arrangement 61 configured to mediate a transfer of the substrates 21 and/or the substrate holders 10 between the pre-treatment apparatus 41, the substrate holder assembly 31 and/or the substrate processing apparatus 51. The substrate handling arrangement 61 comprises at least one loader robot. In some instances, the arrangement comprises more than one loader robots.

The system 100 allows for processing the substrate(s) 21 without exposing thereof to any impurities present in the ambient and/or introduced by touching the samples (if handled by an operator).

Operation mode of the system 10 may be further described based on an example with handling contaminated, e.g. in normal medical practice, medical instruments. The system 100 is beneficial in processing of the used medical instruments, since in addition to applying coatings (for re-use) the system also allows for cleaning said instruments without exposing the latter to mechanical or chemical corrosion, or scratching.

The system provides for supporting the substrate holders 10 in the substrate holder assembly 31 configured to accommodate a number of substrate holders suspended therein in a cradle-like manner. The assembly 31 comprises support means, such as a framework, e.g. a rack, to support the substrate holder(s) 10. The assembly 31 with the substrate holders 10 supported/suspended thereon are inserted into the reaction chamber of the substrate processing apparatus 51. After coating, the assembly 31 is withdrawn from the apparatus 51. The substrate holders 10/the substrates 21 can be unloaded from the assembly in the clean room by the automated arrangement 61.

Prior to being loaded to the substrate holder assembly 31, the substrates 21, in the substrate holder(s) 10 (S1), are advantageously subjected to the pre-treatment in the apparatus 41, e.g. oxygen plasma cleaning (S4'). The mesh or the pores of the substrate holder are sufficiently large to allow gas diffuse through the mesh-/porous structure. Pre-treatment step (S4') may be omitted, whether the substrates 21 are clean/sterile and/or do not require cleaning or other pre-treatment. Alternatively, a rack or a framework, same or similar to that comprised into the assembly 31, can be used in the pre-treatment step.

In the system 100, the substrate holders 10 are preferably handled by the substrate handling arrangement 61. The substrate handling arrangement 61 is advantageously used to support/suspend the substrate holder "cradles" 10 into the assembly 31 and to load the assembly 31 into the substrate processing apparatus 51 (the ALD reactor, for example) via a process specific tool, such as a robot or a linear loader. After the film coating is deposited on the substrates 21, the substrate handling arrangement 61 mediates unloading of the assembly 31 from the apparatus 51 (by using the robot or the linear loader mentioned above, for example).

In addition to abovementioned appliances, the arrangement 61 may further comprise a vacuum load lock, a central vacuum robot sample handling unit (for vacuum cluster configurations), a pneumatic chamber lift (for manual operation), and a number of appliances enabling loading through an inert atmosphere glove box. Thus, although being fully automated, the system 100 does not exclude manual loading and/or other handling options.

Control over the system 100 and its components, the assembly 31 (including substrate holders 10), the pre-treatment apparatus 41, the substrate processing apparatus 51, and the substrate handling arrangement 61, is preferably implemented via a centralized control system (not shown).

The control system advantageously comprises at least one central processing unit (CPU) configured for supervising a number of components (31, 41, 51, 61, etc.) within the system. CPU is set into communication with a human machine interface (HMI) and associated software. In a basic system setup process parameters are programmed with the aid of software and instructions are executed with an HMI terminal and communicated, directly or remotely, to the central control space and/or into the processing unit. The CPU comprises at least one microprocessor for executing a program code stored in a memory, dynamic and static random access memory, I/O modules, A/D and D/A converters and power relays. The CPU transmits and/or receives signals to and/or from various controllers, thermocouples, pressure transducers, switches, and sensors associated with the components 31, 41, 51, 61.

The control system can be provided as an integrated or a standalone CPU solution with a user interface and associated software. Software management functions for CPU are related components may further include implementing local and/or remote control(s), monitoring a number of deposition reactor modules, emergency power control(s) and the like.

The system 100 is preferably located in clean room environment. By way of example, the system may comprise one or more ALD batch tools and one or more at least six-axis (six degrees of freedom) industrial robots to move the batch units, which comprise, in present disclose, packages of substrates 21 positioned in a substrate holder 10 fixture. The assemblies 31 may also be identified as batch units. In an example, the substrate holder 10 can be provided as a mesh- or porous "bag" or a "cradle" allowing a set of substrates hanging in the reaction space (with hook(s) fixed on a frame or with another appropriate arrangement). Alternatively, the substrate holder can be generally configured as a conventional arrangement in the form of a rack with a place for each substrate.

Each batch unit (the assembly 31 (in the form of a rack, for example) and/or the substrate holder 10) can be equipped with an identifier, such as a readable bar code, an RF tag and the like. The identifier can be attached onto the batch unit, when the unit is set into a load lock, whereupon the control system can retrieve identification from a host computer.

The system 100 may be further equipped with a cooling unit and a conventional cleaning unit (not shown). The cooling unit can be a ventilated box or a complex arrangement for controlled cooling of all substrates in the batch. The cleaning unit can be a washing machine or an acid/alkali bath; alternatively, it can be a separate etching unit. Inside the clean room, there is a storage area for batch units configured as a stand/a rack, for example. The storage area allows the system 100 to run fully automatically for a predetermined period of time that depends on processing/deposition time and/or the amount of stored batches.

The robotic means provided in the substrate handling arrangement 61 are arranged to move the batches from the clean room load lock to the storage area and/or directly to the processing apparatuses 51, e.g. the ALD reactor(s). The coating film is deposited according to a recipe specified for a batch. After the coating process is complete, the robot unloads the reactor, moves the batches to the cooling unit and after that to the load lock. The robot may be further configured to clean empty substrate holders.

It shall be appreciated by those skilled in the art that the embodiments set forth in the present disclosure may be adapted and combined as desired. The disclosure is thus intended to encompass any possible modifications of the device and the deposition method, recognizable by those of ordinary skill in the art, within a scope of appended claims.

The invention claimed is:

1. A system comprising a substrate holder, the substrate holder configured as a mesh structure with a sample-receiving surface,
   said substrate holder configured to receive, onto the sample-receiving surface, at least one sample substrate and to at least partially enclose said at least one substrate,
   wherein the substrate holder is configured to allow the substrate(s) to be coated by propagating at least one coating material through the mesh structure to produce a coated substrate, wherein the substrate holder comprises means that render a number of the substrate holders stackable, and
   wherein the substrate holder is configured to fold such, as to form an enclosure for the at least one substrate received at the sample-receiving surface,
   the system further comprising a chamber for performing a vapor deposition process wherein the substrate holder is placed, the chamber further comprising at least one intake line including a regulating device and an evacuation line for discharging an exhaust flow and including at least a pump.

2. The system of claim 1, the substrate holder configured to fold along a folding line such, as to fully enclose the at least one substrate received at the sample-receiving surface.

3. The system of claim 1, in which the mesh structure is rendered with a predetermined mesh size to retain the at least one substrate on the sample-receiving surface.

4. The system of claim 1, the substrate holder further comprising at least one coating layer configured to render the mesh structure with at least one predetermined property.

5. The system of claim 4, wherein said at least one coating layer is configured to at least prevent the substrate(s) received on the mesh structure from being contaminated during subsequent coating with the coating material.

6. The system of claim 1, including a substrate holder assembly, in which a number of substrate holders as defined in claim 1 are supported, in at least partially folded form, optionally one above another.

7. A system for processing substrates, comprising:
   a pre-treatment apparatus;
   a substrate holder assembly, in which a number of substrate holders are supported, in at least partially folded form, optionally one above another, wherein each said substrate holder is a mesh structure configured to receive at least one sample substrate and to at least partially enclose said substrate;
   a substrate processing apparatus with a process chamber for coating substrates provided in the substrate holders; and
   a substrate handling arrangement configured to mediate a transfer of the substrates and/or the substrate holders between the pre-treatment apparatus, the substrate holder assembly and/or the substrate processing apparatus.

8. The system of claim 7, wherein the substrate handling arrangement comprises at least one loader robot.

9. The system of claim 7, wherein the substrate pre-treatment apparatus is configured to treat the at least partially enclosed substrate(s) to remove impurities from the substrate surfaces in a process of a plasma treatment.

10. The system of claim 7, wherein the substrate processing apparatus is a reactor for chemical deposition in vapour phase, such as an Atomic Layer Deposition (ALD) reactor.

* * * * *